United States Patent
Iucolano et al.

(10) Patent No.: US 12,520,517 B2
(45) Date of Patent: Jan. 6, 2026

(54) HEMT DEVICE HAVING LOW CONDUCTION LOSSES AND MANUFACTURING PROCESS THEREOF

(71) Applicant: STMICROELECTRONICS S.r.l., Agrate Brianza (IT)

(72) Inventors: Ferdinando Iucolano, Gravina di Catania (IT); Andrea Severino, Aci Sant'Antonio (IT); Giuseppe Greco, Misterbianco (IT); Fabrizio Roccaforte, Mascalucia (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 391 days.

(21) Appl. No.: 18/167,623

(22) Filed: Feb. 10, 2023

(65) Prior Publication Data

US 2023/0261100 A1    Aug. 17, 2023

(30) Foreign Application Priority Data

Feb. 16, 2022  (IT) ............... 102022000002846

(51) Int. Cl.
H10D 30/47     (2025.01)
H10D 30/01     (2025.01)
H10D 62/832    (2025.01)

(52) U.S. Cl.
CPC ......... *H10D 30/475* (2025.01); *H10D 30/015* (2025.01); *H10D 62/8325* (2025.01)

(58) Field of Classification Search
None
See application file for complete search history.

(56) References Cited

U.S. PATENT DOCUMENTS

| | | | |
|---|---|---|---|
| 2010/0025696 A1 | 2/2010 | Abbondanza et al. | |
| 2013/0256700 A1* | 10/2013 | Ishibashi | C30B 23/025 257/77 |
| 2018/0053649 A1* | 2/2018 | Janzén | H01L 21/02378 |
| 2020/0295174 A1* | 9/2020 | Sabri | H10D 64/512 |

FOREIGN PATENT DOCUMENTS

| | | | |
|---|---|---|---|
| CN | 106981423 A | | 7/2017 |
| JP | 2010225605 A | * | 10/2010 |
| JP | 5212202 B2 | | 6/2013 |

OTHER PUBLICATIONS

Manufacturing Method for Compound Semiconductor Device, and Compound Semiconductor Device (Year: 2010).*
Ishiji et al., "Characterization of Defect Structure in Epilayer Grown on On-Axis SiC by Synchrotron X-ray Topography," Journal of Electronic Materials (2022) 51:1541-1547, https://doi.org/10.1007/s11664-021-09423-4.

(Continued)

*Primary Examiner* — Khaja Ahmad
(74) *Attorney, Agent, or Firm* — Seed Intellectual Property Law Group LLP

(57) ABSTRACT

A manufacturing process forms an HEMT device. For the manufacturing process includes forming, from a wafer of silicon carbide having a surface, an epitaxial layer of silicon carbide on the surface of the wafer A semiconductive heterostructure is formed on the epitaxial layer, and the wafer of silicon carbide is removed.

20 Claims, 3 Drawing Sheets

(56) References Cited

OTHER PUBLICATIONS

Dahal et al., "Fabrication of Thick Free-Standing Lightly-Doped n-Type 4H-SiC Wafers," *Materials Science Forum* 897:379-382, 2017.

Hara et al., "GaN epitaxial growth on 4 degree off-axis Si- and C-face 4H-SiC without buffer layers by tri-halide vapor-phase expitaxy with high-speed wafer rotation," *Japanese Journal of Applied Physics* 58:SC1039-1-SC1039-6, 2019.

Hoke et al., "Reaction of molecular beam epitaxial grown AlN nucleation layers with SiC substrates," *J. Vac. Sci. Technol. B* 24(3):1500-1504, May/Jun. 2006.

Kruszewski et al., "Properties of AlGaN/GaN Ni/Au-Schottky diodes on 2°-off silicon carbide substrates," *Phys. Status Solidi A* 214(4):1600376, 2017. (6 pages).

\* cited by examiner

HEMT DEVICE HAVING LOW CONDUCTION LOSSES AND MANUFACTURING PROCESS THEREOF

BACKGROUND

Technical Field

The present disclosure relates to a high electron mobility transistor (HEMT) device having low conduction losses and to the manufacturing process thereof.

Description of the Related Art

HEMT devices are known wherein a conductive channel is based on the formation of a two-dimensional electron gas (2DEG) having high mobility at a heterojunction, that is at the interface between semiconductor materials having different band gap. For example, HEMT devices based on the heterojunction between an aluminum gallium nitride (AlGaN) layer and a gallium nitride (GaN) layer are known.

The HEMT devices based on AlGaN/GaN heterojunctions or heterostructures offer several advantages that make them particularly suitable and widely used for different applications. For example, the high breakdown voltage of the HEMT devices is exploited for high-performance power switches; the high mobility of the electrons in the conductive channel allows high-frequency amplifiers to be provided; in addition, the high concentration of electrons in the 2DEG allows a low ON-state resistance (RoN) to be obtained.

Moreover, the HEMT devices for radio frequency (RF) applications typically have better RF performances with respect to similar silicon LDMOS devices.

In known HEMT devices, the heterostructure extends on a substrate. In order to reduce, in use, the conductive losses through the substrate, it is desired that the substrate has a high resistivity.

According to one approach, during the manufacturing process of known HEMT devices, the heterostructure is grown on a resistive silicon substrate. However, the heterostructure of the known HEMT devices grown on silicon is subject to a high concentration of crystallographic defects. Consequently, the corresponding HEMT devices have low electrical performances, in use.

According to a different approach, during the manufacturing process of the known HEMT devices, the heterostructure is grown directly on a semi-insulating silicon carbide wafer. However, the semi-insulating silicon carbide wafers have a high cost, especially in the case of wafers having large dimensions, for example having a diameter of 200 mm. Consequently, the HEMT devices obtained from semi-insulating silicon carbide wafers have a high manufacturing cost.

BRIEF SUMMARY

Embodiments of the present disclosure overcome the disadvantages of the prior art.

According to the present disclosure a HEMT device and a manufacturing process thereof are therefore provided. In one embodiment, the process includes forming an epitaxial layer of silicon carbide on a surface of a wafer of silicon carbide, forming a semiconductive heterostructure on the epitaxial layer, and removing the wafer of silicon carbide.

BRIEF DESCRIPTION OF THE SEVERAL VIEWS OF THE DRAWINGS

For a better understanding of the present disclosure, an embodiment thereof is now described, purely by way of non-limiting example, with reference to the attached drawings, wherein.

DETAILED DESCRIPTION

Figure 1:
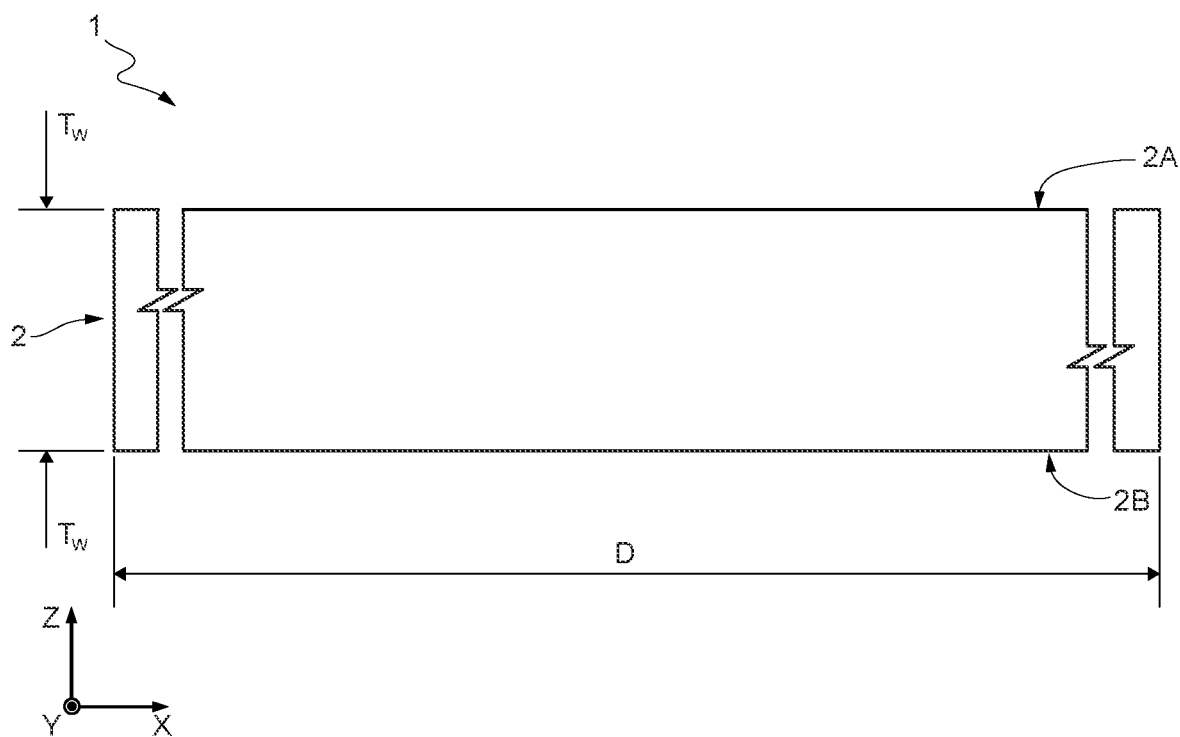
FIGS. 1-5 show cross-sections of a work body in successive manufacturing steps, according to one embodiment.

FIG. 1 shows a work body 1 including a wafer 2 having a front surface 2A and a back surface 2B, in a Cartesian reference system XYZ including a first axis X, a second axis Y and a third axis Z. The front surface 2A and the back surface 2B of the wafer 2 respectively form a front surface and a back surface of the work body 1.

The wafer 2 is of silicon carbide (SiC) in one of its polytypes, for example 3C, 4H, 6H, here of the polytype 4H.

The wafer 2 is a SiC wafer of conductive type, for example having a conductivity of n-type or p-type, here of n-type. In detail, the wafer 2 has a resistivity lower than 0.1 $\Omega$·cm, for example between 0.005 $\Omega$·cm and 0.05 $\Omega$·cm.

For example, the wafer 2 may have a concentration of n-type doping atoms between $1 \cdot 10^{17}$ atoms/cm$^3$ and 1.1019 atoms/cm$^3$.

In this embodiment, the wafer 2 has a cut angle such that the front surface 2A of the wafer 2 is tilted by a non-zero angle with respect to a C-type plane or face of the crystallographic structure of the silicon carbide.

In detail, the front surface 2A of the wafer 2 is tilted by the cut angle with respect to the face (000–1) of the 4H—SiC, wherein the values 0, 0, 0, –1 respectively indicate the indices h, k, i, l of Bravais-Miller.

In practice, the surface 2A of the wafer 2 is an off-axis face of the wafer 2, in particular having a cut angle lower than 4°.

However, the surface 2A of the wafer 2 may have a different cut angle, for example equal to zero; that is, the surface 2A of the wafer 2 may be parallel to the face (000–1) of the 4H—SiC.

The wafer 2 has a thickness Tw along the third axis Z, for example between 100 µm and 500 µm, in particular between 250 µm and 350 µm.

The wafer 2 may have a width or diameter D, parallel to the first axis X, that is high, for example between 50 mm and 200 mm.

The following FIGS. 2-5 show, for simplicity, only a reduced portion, along the first axis X, of the wafer 2.

Figure 2:
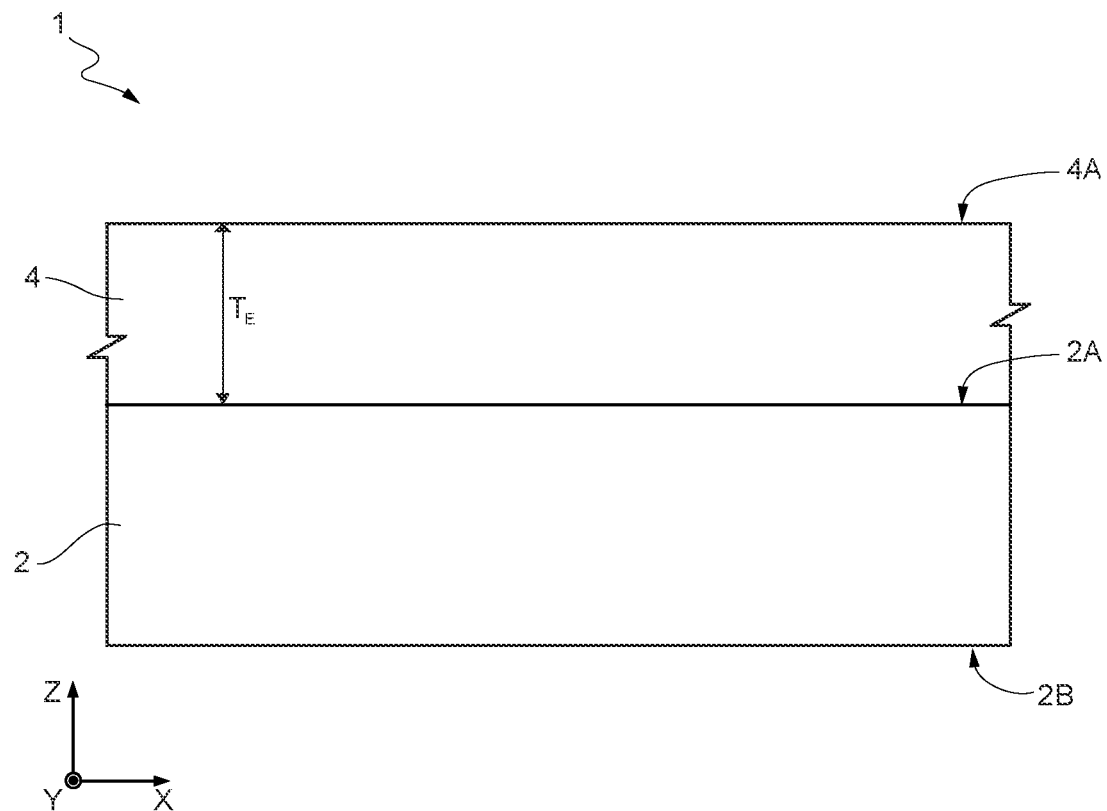

In FIG. 2, an epitaxial layer 4 of silicon carbide is grown on the front surface 2A of the wafer 2. The epitaxial layer 4 has a surface 4A and a thickness TE, along the third axis Z, for example between 60 µm and 100 µm. The surface 4A of the epitaxial layer 4 thus forms a new front surface of the work body 1.

The epitaxial layer 4 is formed by highly resistive silicon carbide, for example having a resistivity greater than 1.104 $\Omega$·cm.

In practice, the epitaxial layer 4 has a greater resistivity than the wafer 2.

In detail, the epitaxial layer 4 is grown so as to have a low concentration of doping atoms.

The epitaxial layer 4 may have a concentration of doping atoms, for example of n-type such as nitrogen atoms, lower than $5 \cdot 10^{14}$ atoms/cm$^3$, in particular between $5 \cdot 10^{11}$ and $5 \cdot 10^{13}$ atoms/cm$^3$.

The epitaxial layer 4 may maintain the crystallographic orientation of the front surface 2A of the wafer 2. Consequently, in this embodiment, the surface 4A of the epitaxial layer 4 may maintain the same cut angle as the front surface 2A of the wafer 2.

In practice, the crystalline structure of the epitaxial layer 4 changes as a function of the cut angle of the front surface 2A of the wafer 2.

Figure 3:
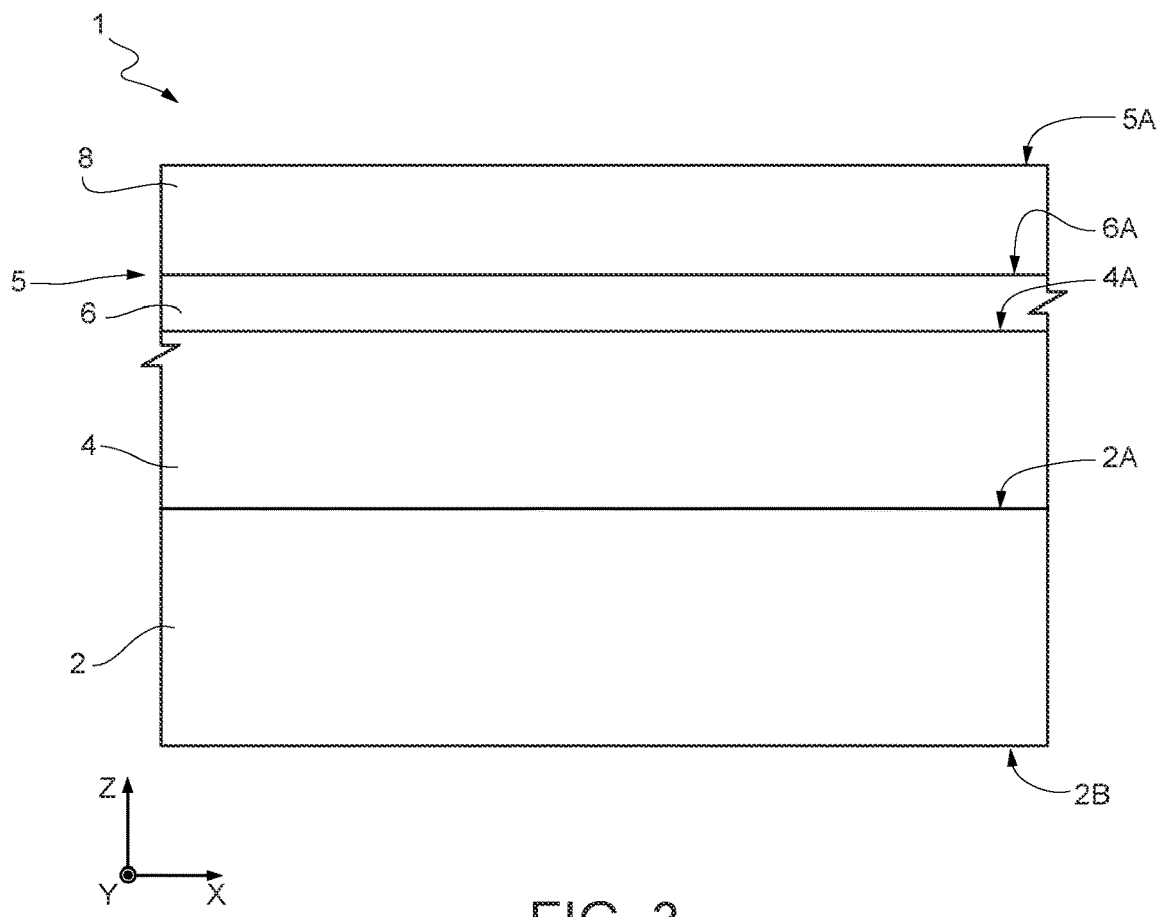

In FIG. 3, a heterostructure 5 is grown on the surface 4A of the epitaxial layer 4. The heterostructure 5 has a surface 5A which forms a new front surface of the work body 1.

The heterostructure 5 comprises compound semiconductor materials including elements of the group III-V.

In detail, the heterostructure 5 is formed by a channel layer 6 of a first semiconductor material, for example gallium nitride (GaN) or an alloy including gallium nitride such as InGaN, here of intrinsic gallium nitride (GaN), extending on the epitaxial layer 4, and by a barrier layer 8 of a second semiconductor material, for example a compound based on a ternary or quaternary alloy of gallium nitride, such as $Al_xGa_{1-x}N$, AlInGaN, $In_xGa_{1-x}N$, $Al_xIn_{1-x}Al$, AlScN, here of intrinsic aluminum gallium nitride (AlGaN), extending on the channel layer 6.

In detail, the channel layer 6 extends on the surface 4A of the epitaxial layer 4, in direct contact therewith.

The barrier layer 8 extends on the channel layer 6, in direct contact therewith; the heterostructure 5 therefore comprises an interface 6A between the channel layer 6 and the barrier layer 8.

Figure 4:
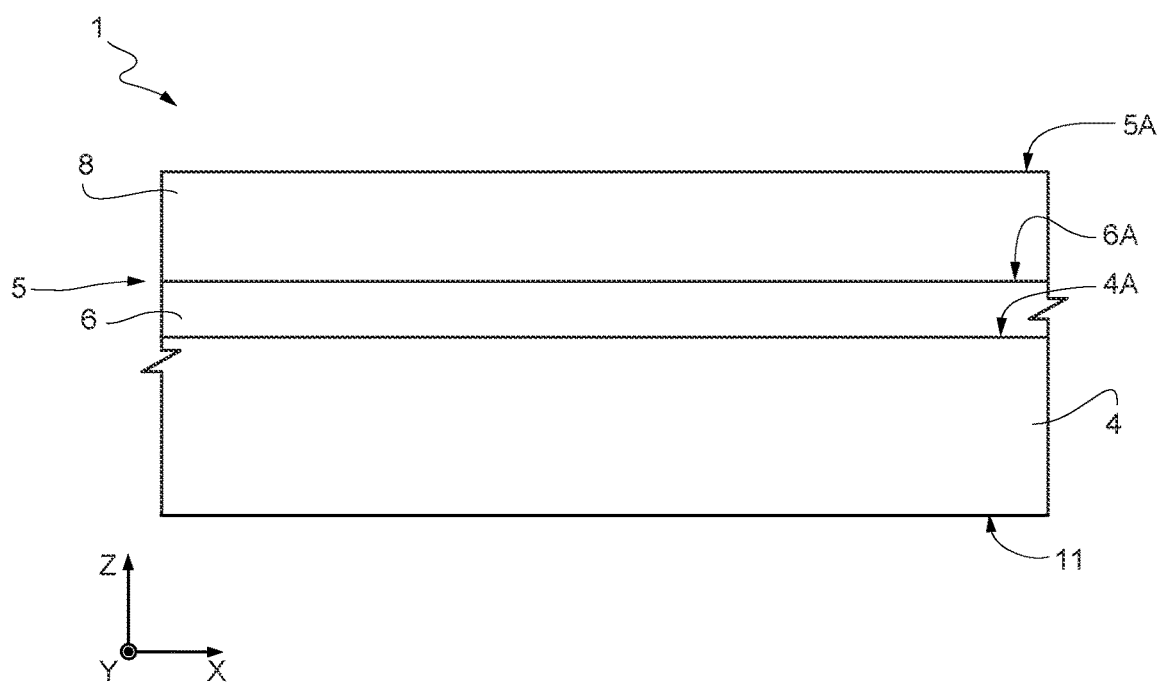

Subsequently, FIG. 4, the wafer 2 is removed. For example, the wafer 2 may be removed through a thinning process such as mechanical grinding, chemical mechanical polishing (CMP) or slicing through a laser process.

To verify the complete removal of the wafer 2, the state of removal of the wafer 2 may be controlled through an electrical measurement, for example through a mercury probe C-V measurement, or through an optical measurement.

In practice, the epitaxial layer 4 now forms the back surface, here indicated by 11, of the work body 1.

Figure 5:
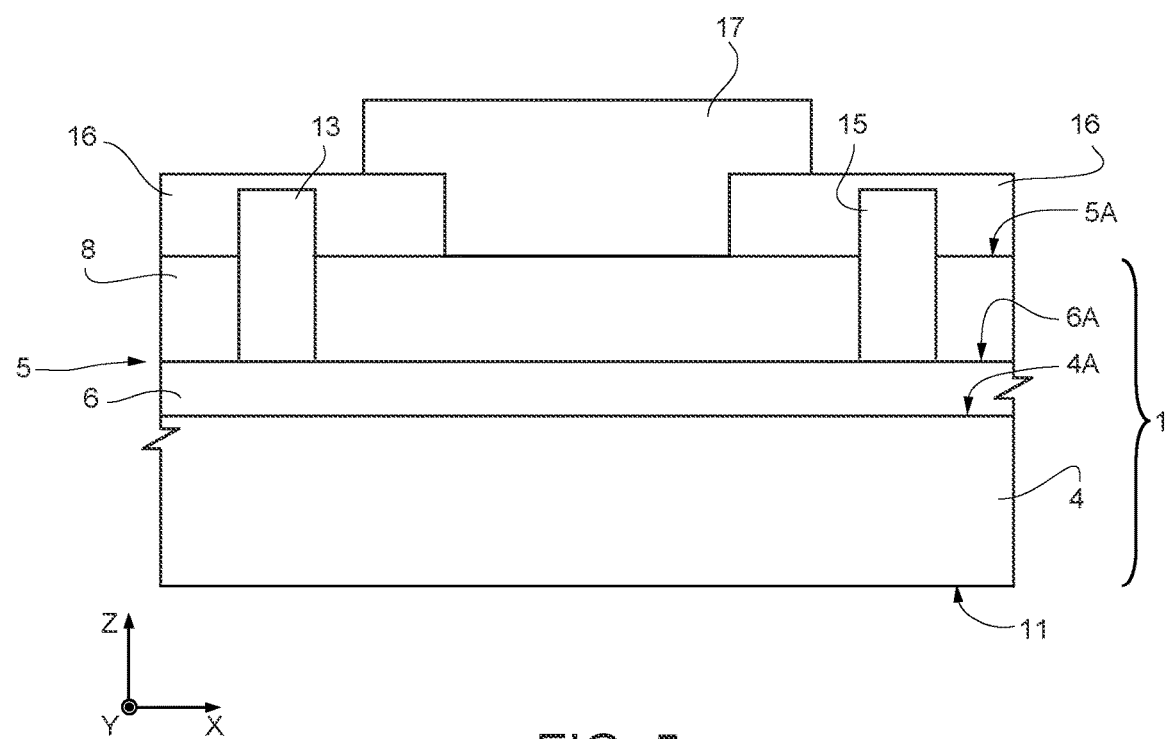

In FIG. 5, a source region 13, a drain region 15, an insulation or passivation layer 16 and a gate region 17 are formed.

The source region 13 and the drain region 15 are of conductive material and extend in direct electrical contact with the heterostructure 5, in particular in ohmic contact with the channel layer 6.

In this embodiment, the source region 13 and the drain region 15 extend in depth into the heterostructure 5, up to the interface 6A. However, the source region 13 and the drain region 15 may extend into the heterostructure 5 up to a different depth, depending on the specific application.

The insulation layer 16 is of dielectric material, for example silicon nitride or silicon oxide and extends on the surface 5A of the heterostructure 5.

The gate region 17 comprises conductive material and extends through the insulation layer 16, between the source region 13 and the drain region 15, in direct electrical contact with the heterostructure 5.

For example, the gate region 17 may be formed by a single conductive layer or by a stack of conductive layers, including for example gold, nickel, titanium, etc., depending on the specific application.

According to an embodiment, the gate region 17 may be formed by an insulating layer, in direct contact with the heterostructure 5, and one or more conductive layers extending on the insulating layer, so that the one or more conductive layers are not in direct electrical contact with the heterostructure 5.

According to an embodiment, the gate region 17 may also partially extend within the heterostructure 5, depending on the specific application.

Figure 6:
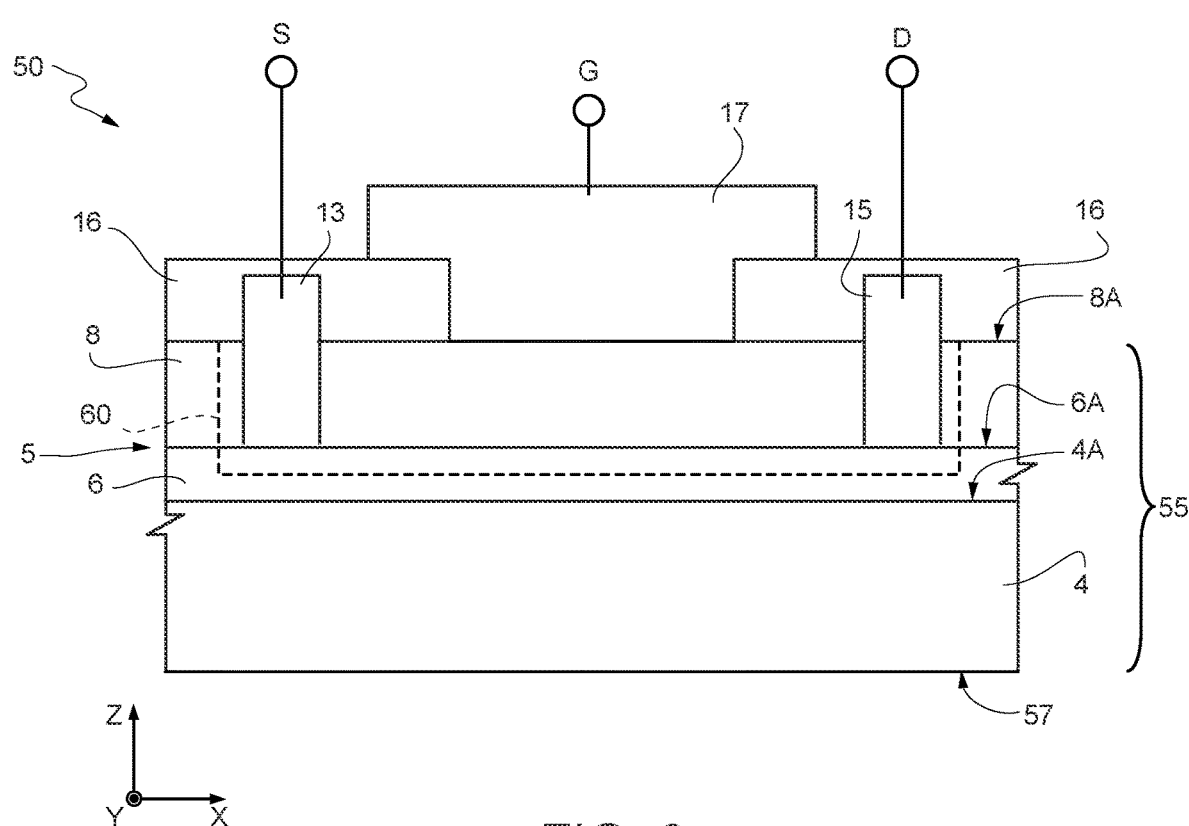
FIG. 6 shows a cross-section of an HEMT device, according to one embodiment.

The work body 1 is then subject to final manufacturing steps such as dicing and electrical connection, of a per se known type, thus forming a HEMT device 50 (FIG. 6).

The HEMT device 50 is particularly suitable for being used in RF applications, such as for example 4G and 5G base stations, including technology evolutions and variants, mobile phones, RF heat treatment devices, drying and heating devices, devices and systems for avionics, L- and S-band radar, and the like.

The HEMT device 50 is formed in a body or die 55 having a back surface 57 and includes an epitaxial substrate 4 (corresponding to the epitaxial layer 4 and therefore indicated by the same reference number) and the heterostructure 5 extending in direct contact on the epitaxial substrate 4.

The epitaxial substrate 4 has a thickness along the third axis Z comprised, for example, between 60 μm and 100 μm, and forms the back surface 57 of the body 55.

In practice, the back surface 57 is an external surface of the body 55, delimiting the body 55 at the back.

The source region 13, the drain region 15 and the gate region 17 respectively form a source electrode S, a drain electrode D and a gate electrode G of the HEMT device 50.

The body 55 accommodates an active region 60, indicated by a dashed line in FIG. 6, which accommodates, in use, a conductive channel of the HEMT device 50.

In use, the fact that the epitaxial substrate 4 has a low concentration of impurities and therefore a high resistivity, causes the HEMT device 50 to have low conductive losses through the epitaxial substrate 4, especially in radiofrequency applications.

In fact, in radiofrequency applications, the back surface 57 of the HEMT device 50 may be used, for example, as the RF reference (ground) terminal of the HEMT device 50. In this case, the high resistivity of the epitaxial substrate 4 allows to reduce the conductive losses between the gate region 17 and the back surface 57 and thus improve the RF performances of the HEMT device 50.

Furthermore, the fact that the manufacturing of the HEMT device 50 starts from the wafer 2, which is of conductive type, allows the use of SiC wafers having a large diameter and at the same time having a low cost, for example the diameter D of the wafer 2 may be up to 200 mm, or even greater.

The possibility of using SiC wafers having large dimension and a low cost allows the manufacturing costs of the HEMT device 50 to be further reduced.

Finally, it is clear that modifications and variations may be made to the HEMT device 50 and to the manufacturing process thereof described and illustrated herein without thereby departing from the scope of the present disclosure, as defined in the attached claims.

For example, the channel layer 6 and the barrier layer 8 may each be formed by a plurality of layers superimposed on each other, for example one or more layers of GaN, or GaN-based alloys, suitably doped or of intrinsic type, depending on the specific application.

For example, the HEMT device 50 may be of normally-off or normally-on type.

For example, the source region 13, the drain region 15 and the gate region 17 may have shapes other than what has been shown, depending on the specific application and on the specific design parameters.

The source region 13, the drain region 15 and the gate region 17 may extend along the second axis Y according to different shapes and configurations, depending on the specific application. For example, in a top-plan view, here not shown, the source region 13, the drain region 15 and the gate region 17 may have a shape of elongated strips along the second axis Y, or may have a circular shape or any other shape, regular or non-regular.

For example, the source region 13, the drain region 15 and the gate region 17 may each form a portion of a respective region having a more complex shape and electrically connected to other portions through specific electrical connections.

The manufacturing steps shown in FIGS. 1-5 may be performed in a different order from that shown. For example, the source region 13, the drain region 15 and the gate region 17 may be formed before the wafer 2 is removed. Otherwise, the wafer 2 may be removed before the heterostructure 5 is grown.

In one embodiment, manufacturing process of a HEMT device (50), from a wafer (2) of silicon carbide having a surface (2A), may include forming an epitaxial layer (4) of silicon carbide on the surface (2A) of the wafer (2), forming a semiconductive heterostructure (62) on the epitaxial layer, and removing the wafer of silicon carbide.

The wafer of silicon carbide may have a first resistivity and the epitaxial layer may have a second resistivity greater than the first resistivity.

The wafer of silicon carbide may have a resistivity lower than 0.1 Ω·cm.

The epitaxial layer may have a concentration of doping atoms lower than $5 \cdot 10^{14}$ atoms/cm³.

The surface (2A) of the wafer of silicon carbide may have a non-zero cut angle with respect to a C-type plane of the wafer (2).

The cut angle may be lower than 4°.

The epitaxial layer (4) may have a thickness between 60 μm and 100 μm.

In one embodiment, a HEMT device (50) may be formed in a semiconductor body (55) having an external surface (57). The HEMT device may include a substrate (4) of silicon carbide forming the external surface of the semiconductor body and a semiconductive heterostructure (5) extending on the substrate. The substrate (4) is of epitaxial type.

The substrate may have a concentration of doping atoms lower than $5 \cdot 10^{14}$ atoms/cm³. The substrate (4) may have a surface (4A) that is off-axis with respect to a C-type plane of the silicon carbide. The semiconductive heterostructure (5) extends in direct contact on the surface (4A) of the substrate.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A manufacturing process of a HEMT device, the process, comprising:

forming an epitaxial layer of silicon carbide on a surface of a wafer of silicon carbide;

forming a semiconductive heterostructure on the epitaxial layer; and removing the wafer of silicon carbide while keeping the semiconductive heterostructure on the epitaxial layer.

2. The manufacturing process according to claim 1, wherein the wafer of silicon carbide has a first resistivity and the epitaxial layer has a second resistivity greater than the first resistivity.

3. The manufacturing process according to claim 1, wherein the wafer of silicon carbide has a resistivity lower than 0.1 Ω·cm.

4. The manufacturing process according to claim 1, wherein the epitaxial layer has a concentration of doping atoms lower than $5 \cdot 10^{14}$ atoms/cm³.

5. The manufacturing process according to claim 1, wherein the surface of the wafer of silicon carbide has a non-zero cut angle with respect to a C-type plane of the wafer.

6. The manufacturing process according to claim 5, wherein the cut angle is lower than 4°.

7. The manufacturing process according to claim 1, wherein the epitaxial layer has a thickness between 60 μm and 100 μm.

8. A method, comprising:

forming, on a wafer of silicon carbide having a first resistivity, a substrate of silicon carbide having a second resistivity at least ten thousand times greater than the first resistivity;

forming a semiconductor heterostructure on the substrate of silicon carbide;

removing the wafer from the substrate while keeping the semiconductor heterostructure on the substrate of silicon carbide; and forming a HEMT device in conjunction with the semiconductor heterostructure.

9. The method of claim 8, wherein the first resistivity is between 0.005 Ω·cm and 0.05 Ω·cm.

10. The method of claim 9, wherein the second resistivity is greater than 10 kΩ·cm.

11. The method of claim 8, wherein the substrate has a thickness between 60 μm and 100 μm.

12. The method of claim 8, wherein the substrate has a concentration of nitrogen atoms between $5 \cdot 10^{11}$ and $5 \cdot 10^{13}$ atoms/cm³.

13. A manufacturing process of a HEMT device, comprising:

forming, on a wafer of silicon carbide having a first resistivity, an epitaxial layer of silicon carbide having a greater resistivity than the wafer;

forming a channel layer of semiconductor material on the epitaxial layer of silicon carbide;

forming a barrier layer of semiconductor material on the channel layer;

removing the wafer from the epitaxial layer of silicon carbide removing the wafer from the epitaxial layer of silicon carbide while keeping the barrier layer of semiconductor material on the channel layer on the epitaxial layer of silicon carbide;

forming a gate region of a HEMT device on the barrier layer; and forming a source region and a drain region of the HEMT extending through the barrier layer and contacting the channel layer.

14. The manufacturing process according to claim 13, wherein the epitaxial layer of silicon carbide has a concentration of doping atoms lower than $5 \cdot 10^{14}$ atoms/cm$^3$.

15. The manufacturing process according to claim 13, wherein the epitaxial layer of silicon carbide has a surface that is off-axis with respect to a C-type plane of the silicon carbide, the semiconductive heterostructure extending in direct contact on the surface of the substrate.

16. The manufacturing process of claim 13, wherein the epitaxial layer of silicon carbide has a resistivity greater than 10 kΩ·cm.

17. The manufacturing process of claim 13, wherein the epitaxial layer of silicon carbide has a concentration of doping atoms between $5 \cdot 10^{11}$ and $5 \cdot 10^{13}$ atoms/cm$^3$.

18. The manufacturing process of claim 13, wherein the surface of the epitaxial layer of silicon carbide has a non-zero angle with respect to a C-type plane of the silicon carbide.

19. The manufacturing process of claim 18, wherein the angle is lower than 4°.

20. The manufacturing process of claim 19, wherein the epitaxial layer of silicon carbide has a thickness between 60 μm and 100 μm.

\* \* \* \* \*